United States Patent [19]

Kitajima et al.

[11] 4,396,700

[45] * Aug. 2, 1983

[54] PROCESS FOR FORMING AN IMAGE

[75] Inventors: Masao Kitajima; Hiromichi Tachikawa; Fumiaki Shinozaki; Tomoaki Ikeda, all of Asaki, Japan

[73] Assignee: Fuji Photo Film Co., Ltd., Kanagawa, Japan

[*] Notice: The portion of the term of this patent subsequent to Jul. 1, 1997, has been disclaimed.

[21] Appl. No.: 331,742

[22] Filed: Dec. 17, 1981

Related U.S. Application Data

[63] Continuation of Ser. No. 172,483, Jul. 25, 1980, abandoned, which is a continuation of Ser. No. 966,997, Dec. 6, 1978, abandoned.

[30] Foreign Application Priority Data

Dec. 6, 1977 [JP] Japan ................ 52-145686

[51] Int. Cl.³ ............ G03C 1/54; G03C 1/71; G03C 5/18; G03C 11/12
[52] U.S. Cl. .................. 430/254; 430/141; 430/142; 430/143; 430/159; 430/162; 430/167; 430/175; 430/176; 430/197; 430/253; 430/271; 430/275; 430/158
[58] Field of Search ............ 430/253, 254, 141, 142, 430/143, 159, 162, 167, 175, 176, 192, 197, 271, 275, 158

[56] References Cited

U.S. PATENT DOCUMENTS 3,060,023 10/1962 Burg et al. .................... 430/254
3,703,373 11/1972 Alsup et al. .................... 430/254
3,721,557 3/1973 Inoue ............................ 430/293
4,205,989 6/1980 Moriya et al. ................ 430/253
4,210,711 7/1980 Kitajima et al. ............... 430/253
4,284,703 8/1981 Inoue et al. .................. 430/254
4,347,300 8/1982 Shimazu et al. ............... 430/253

FOREIGN PATENT DOCUMENTS 986773 4/1976 Canada .......................... 430/253
38-09663 6/1962 Japan .

OTHER PUBLICATIONS

Chemical Abstracts, vol. 87, #19212GW, 1977 (Inoue et al. Japan Kokai 77-57,819, 5/1977).
Japanese Pat. OPI 38-9663, 6/19/1962, English Translation Submitted in Paper No. 5 of Parent Case, S.N. 966,997, 9 pages.
Japan Kokai 77-57,819, 5/1977, Partial English Translation Submitted in Paper No. 6 of Parent Case, S.N. 172,483, 15 pages.

*Primary Examiner*—Charles L. Bowers, Jr.
*Attorney, Agent, or Firm*—Sughrue, Mion, Zinn, Macpeak & Seas

[57] ABSTRACT

A process for forming an image is disclosed wherein a photosensitive image-forming material comprising a diazonium compound or an azide compound is exposed and developed by a peeling development method wherein a development carrier sheet having thereon a layer of an adhesive composition is adhered to the image-forming material, before or after exposure, and, after exposure, peeled from the image-forming material whereby the exposed areas of the photosensitive layer are adhered to the carrier sheet thereby forming a relief image, and the unexposed areas remaining adhered to the support also forming a relief image.

15 Claims, 3 Drawing Figures

PROCESS FOR FORMING AN IMAGE

This application is a continuation application of Ser. No. 172,483, filed July 25, 1980, now abandoned, in turn a continuation application of Ser. No. 966,997, filed Dec. 6, 1978, now abandoned.

BACKGROUND OF THE INVENTION

1. Field of the Invention

This invention relates to a process for forming an image, and especially, to a method for obtaining a relief image which comprises imagewise exposing a photosensitive image-forming material and subjecting it to dry development.

2. Brief Discussion of the Prior Art

The present invention relates to a process for forming an image, which comprises imagewise exposing a photosensitive image-forming material composed of a support having formed thereon a layer of a photosensitive composition containing a diazonium compound or an aromatic azide compound and a thermoplastic binder and adhering the photosensitive composition layer closely to a development carrier sheet having a layer of an adhesive composition; or imagewise exposing said photosensitive image-forming material with said carrier sheet in intimate contact; and then peeling said image-forming material and said carrier sheet from each other to transfer and adhere the exposed area of the photosensitive composition layer to the carrier sheet and thereby form a relief image on it, and simultaneously form a relief image corresponding to the non-transferred, non-exposed area of the photosensitive composition on the support.

Many methods for forming images by the dry-method development of a photosensitive compositions have been suggested heretofore which include, for example, developing an exposed photosensitive material by heating a "thermodeveloping method", with a suitable radiation ray, with a gas, with an electrostatic treatment, and by the application of pressure.

One typical dry developing method is a so-called peeling development process wherein a photosensitive image-forming material composed of a support, a layer of a photosensitive composition on the support and a cover sheet placed on the photosensitive layer in which the adhesion of the photosensitive layer to the support and to the cover sheet changes by exposure, and after exposure, peeling the support and the cover sheet from the photosensitive layer to leave only the exposed area on the support or the cover sheet and the unexposed area on the other, both as a relief image.

The method of image formation by peeling development is operated in the dry state, and the operation is simpler than ordinary liquid development using a large quantity of water or solvent. Furthermore, only the image area of the photosensitive image-forming composition which remains on the support after peeling, the non-image area is removed from the support by the peeling operation. Accordingly, this method has the advantage that the stabilization of the non-image area essential to photosensitive materials developed by an ordinary liquid developing method or thermodeveloping method, that is, its fixation, can be performed simultaneously with the developing operation. Since in the peel developing method, the photosensitive composition in the non-image area is fixed to the peel sheet as a solid layer, it can be disposed of easily, and this is desirable from the standpoint of environmental preservation. When the composition contains useful ingredients, they can be completely recovered and easily reused. Thus, this processing method is advantageous from the viewpoint of saving resources, too.

Since a general procedure for image formation by peeling was published in Japanese Patent Publication No. 9663/63, a number of specific techniques have been suggested. These techniques are classified by their basic characteristics, and briefly described below.

A three-layer structure composed of a support, a photosensitive layer on it containing a photopolymerizable monomer and a cover sheet laminated to the photosensitive layer constitutes a very important field in the art. Peel development of this photosensitive material is performed by utilizing the fact that polymerization proceeds in the exposed area of the material, and, therefore, the adhesion of the photosensitive layer to the support and to the cover sheet differs between the exposed area and unexposed area. It is described, for example, in Japanese Patent Publication No. 3193/62 (U.S. Pat. No. 3,060,024), Japanese Patent Publication No. 22901/68 (U.S. Pat. No. 3,353,955), Japanese Patent Application (OPI) No. 7728/72 (The term "OPI" as used herein refers to a "published unexamined Japanese patent application") (U.S. Pat. No. 3,770,438), and U.S. Pat. Nos. 3,060,023 and 3,525,615. U.S. Pat. Nos. 3,627,529, 3,591,377 and 3,607,264, etc., disclose a similar peel-developable photosensitive material consisting essentially of a support, a photosensitive layer and a transparent cover sheet in which the photosensitive composition layer contains a photocurable polyester (U.S. Pat. No. 3,591,377), a photocurable olefin compound (U.S. Pat. No. 3,607,264) or a photocuring catalyst and a thiol-containing olefin polymer (U.S. Pat. No. 3,627,529).

The methods described above perform peel development by utilizing changes in adhesion incident to the photochemical reaction of a photopolymerizable monomer or a photocurable compound.

Methods using other photosensitive compounds are also known. For example, Japanese Patent Application (OPI) No. 57819/77 discloses a method which comprises using a laminate structure composed of a sheet consisting of a support and an adhesive composition layer formed thereon, and a transparent plastic film coated with a photosensitive composition comprising a diazonium salt and a binder, exposing the laminate structure, and then peeling the film thereby to leave the unexposed area of the photosensitive composition layer on the transparent plastic film and the exposed area on the support.

Japanese Patent Application (OPI) No. 3215/78 discloses an invention relating to a method which uses a similar sheet composed of a support and an adhesive composition layer formed thereon. A thin film layer comprising a metal or chalcogen is further provided between the support and a photosensitive composition layer to form a five-layer laminate structure. It utilizes the phenomenon that peel development after exposure induces selective separation at the interface between the non-sensitive thin film layer and the support.

In the invention disclosed in Japanese Patent Application (OPI) No. 23632/78, a photosensitive composition containing a polyhalogen compound and a polymer having a phenol nucleus is used, and by peeling a transparent film-like material adhering to the photosensitive composition layer before or after exposure, an image corresponding to the exposed image is obtained on the support.

British Pat. No. 1,319,295 discloses a peel developing method which comprises laminating a heat-softenable polymeric layer and a powder capable of absorbing infrared rays to a support, exposing the resultant material to infrared rays to impart tackiness imagewise to the heat-softenable polymeric layer, and separating the polymeric layer from the support to form an image on the support.

So far, the characteristics of known techniques about image formation by peeling have been described. Heretofore, the basic principle of peel development has been considered to lie in the changing of the adhesion between the photosensitive composition layer and the support by light. For example, according to peel development, a photopolymerizable or photocurable photosensitive composition is used, and by a photochemical composition at the exposed area, the adhesion of the photosensitive layer to the support is decreased or increased from that before exposure, whereby the exposed area and the unexposed area are formed as images separated on different supports. Accordingly, a method for forming an image was suggested which comprises exposing a photosensitive composition in intimate contact with a cover sheet and peeling the cover sheet by utilizing the fact that the photosensitive adhesive layer has suitable tackiness at room temperature.

On the other hand, Japanese Patent Application (OPI) Nos. 57819/77 and 141003/76 and 3215/78 (U.S. patent application Ser. No. 810,828, filed June 28, 1977), for example, disclose a method in which the adhesive quality of the photosensitive composition layer itself is not essential. The adhesion required for peeling development is obtained by providing a cover sheet with a pressure-sensitive adhesive layer. The adhesive cover sheet is adhered intimately to the photosensitive composition layer before or after imagewise exposure, and then peeled off. Accordingly, a broader range of selection for the characteristics of the photosensitive composition is possible than the aforesaid methods which use a photopolymerizable compound as a material and utilize the tackiness of the photosensitive composition layer itself at ordinary temperatures.

Some techniques which perform the separation of an image more effectively by heating the image-forming material at the time of peeling have been disclosed. For example, U.S. Pat. No. 3,060,023 discloses a method which comprises using a mixture of a photopolymerizable monomer and a thermoplastic polymer as a photosensitive composition layer, and afterexposure, bringing the photosensitive layer into intimate contact with a receptor sheet at a temperature of at least 40° C. thereby to soften the unexposed area, i.e., the unpolymerized area of the photopolymerizable monomer, selectively and to transfer the image thermally onto the receptor sheet. It is clearly seen from the disclosure of the specification that this technique utilizes the transfer of the unexposed area (unpolymerized area) of the thermoplastic photopolymerizable composition to the receptor sheet under heat, and it affords a number of copies by bringing the exposed photopolymerizable composition layer into contact with a suitable support to transfer the unexposed area under heat. Since in this method a transfer image composed of the unpolymerized area is always utilized as an image, when it is desired to utilize the image obtained on the support further for a printing plate or a photoresist, it is necessary to provide an additional step of curing the transferred image by an aftertreatment such as exposure.

Japanese Patent Application (OPI) No. 39025/76 discloses a method which comprises imagewise exposing a three-layer image-forming material composed of a metal substrate, a layer of a photosensitive composition comprising an addition-polymerizable monomer and polyvinyl butyral and a cover sheet, and peeling the exposed material while heating it, thereby to induce cohesive destruction of the unexposed area (i.e., unpolymerized area) of the photosensitive layer and to obtain the same positive image as used in imagewise exposure on the metal substrate which image is utilized as a photoresist image.

Thus, there have been examples in which heating is performed at the time of peeling. All of these examples use a layer of a photopolymerizable composition, and facilitate the transfer of an image to an image-receiving sheet by increasing the flowability of the unexposed area through heat.

The present invention relates to a process for forming an image, which comprises imagewise exposing a photosensitive image-forming material composed of a support and formed thereon a layer of a photosensitive composition containing a diazonium compound or an aromatic azide compound and a thermoplastic binder and then adhering the photosensitive composition layer closely to a carrier sheet having a layer of an adhesive composition; or imagewise exposing said photosensitive image-forming material in intimate contact with said carrier sheet; and then peeling said image-forming material and said carrier sheet from each other to transfer and adhere the exposed area of the photosensitive composition layer to the development carrier sheet and to form a relief image on it, and simultaneously form a relief image corresponding to the non-transferred, nonexposed area of the photosensitive composition on the support.

Japanese Patent Application (OPI) No. 57819/77 discloses a method for image formation by peeling operation in which a diazonium compound is used as a photosensitive substance. This method relies upon a photosensitive image-forming material composed of a support, an adhesive composition thereon, a photosensitive layer and a transparent plastic film, and comprises peeling the plastic film from the laminate after imagewise exposure whereby the unexposed area of the photosensitive composition layer adheres to the adhesive layer, and the exposed area of the photosensitive composition layer remains on the support. While the photosensitive composition used in conventional image-forming methods by a peeling operation are limited to photopolymerizable or photohardenable compositions, the Japanese (OPI) relies on a film having an dhesive composition layer as a means for obtaining relief images upon peeling development of a photosensitive composition layer composed of a combination of 4-(p-tolylthio)-2,5-dibutoxybenzenediazonium chloride/zinc chloride double salt or an aromatic azide compound and a binder polymer. In this invention, the exposed areas of the photosensitive composition remain on the support and the corresponding unexposed areas adhere adhesive composition layer on the carrier sheet, as a separate relief image.

SUMMARY OF THE INVENTION

A principal object of the present invention is to provide a process for forming a relief image by peeling development wherein photosensitive materials, previously felt unsuitable for peeling development methods, are used.

Another object of the present invention is to provide a process for peeling development wherein the photosensitive composition is not adhesive or tacky at room temperature.

A further object of the present invention is to provide a process for forming images wherein a photosensitive material comprising diazonium compounds or azide compounds is exposed and developed by a peeling development method.

Still a further object of the present invention is to provide a process for forming images wherein it is not required to cover the image-forming material with a cover sheet prior to exposure such that intimate contact can be achieved between the image-forming material and the original image transparency.

Another object of the present invention is to provide a process for forming relief images suitable for use in forming printing plates, printed circuits, etc.

The present inventors have made extensive investigations, and found that by imagewise exposing a photosensitive image-forming material composed of a support and a layer of a photosensitive composition composed of a diazonium compound or an aromatic azide compound and a binder through an original image positive transparency, adhering the exposed material closely to a development carrier sheet containing a layer of an adhesive composition, and then peeling the two elements from each other, a positive relief image of good quality can be formed on the support. This has led to the accomplishment of the present invention.

The invention will be described in detail hereinbelow.

DETAILED DESCRIPTION OF THE INVENTION

Figure 1:
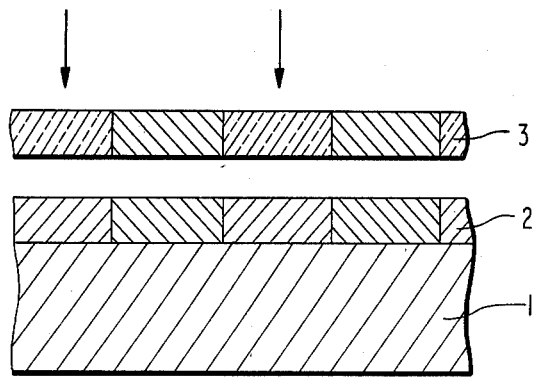
FIG. 1 illustrates exposure of the photosensitive image-forming material in accordance with this invention through an original image transparency.

The photosensitive composition used in this invention comprises a diazonium or aromatic azide compound and a binder. If desired, it may contain additives to preserve and stabilize the photosensitive substances, color the image, increase the peeling development performance or to render the images visible, or for other purposes.

One characteristic feature of this invention is the use of a carrier sheet having a layer of an adhesive composition in peeling development.

The use of a layer of an adhesive composition for peeling development is described in Japanese Patent Application (OPI) No. 57819/77. In this method, the image-forming material has a four-layer structure of a support, a photosensitive image-forming layer, an adhesive composition layer and a carrier film for the adhesive layer. The method produces positive image on the support by combining a specific diazonium or azide compound and a binder and using a negative transparency.

In contrast, according to the process of this invention, a broader range of diazonium compounds or aromatic azide compounds can be used as photosensitive compounds by properly selecting the support.

Another characteristic feature of this invention which distinguishes it from OPI 57819/77 is that the layer of the photosensitive composition is a solid layer and is not tacky at ordinary temperatures (e.g., about 5° to about 40° C.). Since it is not tacky, it is not necessary to apply the cover sheet, which is essential to using a photosensitive composition layer containing a photopolymerizable monomer flowable or tacky at room temperature, before or during exposure. Accordingly, the transparency and the photosensitive composition layer can be maintained in completely intimate contact during exposure. Accordingly, scattering, reflection, etc., caused by the presence of a cover sheet can be minimized. Thus, a marked improvement is brought about in the resolving power of images which is considered to be most defective in conventional peel developing methods. For example, according to the process of this invention, images with a line width of 15 μm can be resolved without great difficulty.

The useful aromatic diazonium compounds in this invention are represented by the general formula $$ArN_2^+X$$

wherein $N_2$ represents a diazonium group ($-N\equiv N^+$) and Ar represents an aromatic moiety known to those skilled in the art to be useful for forming stable photosensitive diazonium compounds. This moiety is well known to those skilled in the art, and described, for example, in Kosar, *Light-Sensitive Systems*, John Wiley & Sons, Inc., New York, N.Y. (1965), pages 202–214, and Glafkides, *Photographic Chemistry*, Vol. 11, Fountain Press, London, England (1960), pages 709–725. The stability here means that a compound is stable under nonactinic light, i.e., visible and near infrared light.

The diazonium salts which can be used in this invention are classified by their structures and illustrated below.

The above diazonium salts include compounds in which the Ar group of the above general formula represents an N-substituted-4-aminobenzenediazonium group, N,N-substituted-4-amino-substituted benzenediazonium group or S-substituted-4-mercaptobenzenediazonium group, and X represents an anion. The N-substituted amino group includes, for example, a dialkylamino group, a dialkylamino group with the two alkyl groups being different from each other (examples of alkyl groups are methyl, ethyl, isopropyl, etc.), a phenylamino group or a heterocyclic group such as a morpholino, piperidino, piperazinyl or pyrrolidinyl group. The benzene ring may be further substituted by an alkyl, alkoxy, phenoxy or trifluoromethyl group or a halogen atom. The substituted mercapto group may be an alkylthio or arylthio group (the alkyl groups being as defined for the alkylamino and examples of the aryl group including phenyl, tolyl, ethylphenyl, naphthyl, etc.).

Examples of the anion (X) are those of a metal halide such as zinc chloride or stannic chloride, a boron compound such as tetrafluoroborate or tetraphenyl borate, perchloric acid, an organic acid such as p-toluenesulfonic acid, hexafluorophosphate, hexafluoroarsenate, and hexafluoroantimonate. They form double salts with the above diazonium compounds to contribute to the enhancement of their stability.

Some of the diazonium salts of the general formula ArN₂X are specifically disclosed below, however, the present invention is not limited to the use of these specific compounds.

Diazonium salts having a dialkylamino group introduced as an N-substituted amino group in the aforesaid residue include 4-(N,N-diethylamino)benzenediazonium salt, 4-(N,N-dimethylamino)benzenediazonium salt, 2-methyl-4-(N,N-diethylamino)benzenediazonium salt, and 2-chloro-4-(N,N-diethylamino)benzenediazonium salt. Diazonium salts having a dialkylamino group introduced as an N-substituted amino group in the aforesaid residue, the two alkyl groups being different from each other include 4-(N-methyl-N-ethylamino)benzenediazonium salt. Diazonium salts having a phenylamino group introduced as an N-substituted amino group in the aforesaid residue include 4-(N-ethyl-N-benzylamino)benzenediazonium salt, and 4-anilinobenzenediazonium salt. Diazonium salts having a heterocyclic group introduced as an N-substituted amino group in the aforesaid residue include 4-morpholinobenzenediazonium salt, 2,5-dibutoxy-4-morpholinobenzenediazonium salt, 2,5-diethoxy-4-morpholinobenzenediazonium salt, 2,5-diethoxy-4-morpholinobenzenediazonium salt, and 3-methyl-4-pyrrolidinylbenzenediazonium salt. Diazonium salts containing an S-substituted-4-mercapto groups include 4-ethylmercapto-2,5-diethoxybenzenediazonium salt and 4-tolylmercapto-2,5-diethoxybenzenediazonium salt.

The diazonium salts used in the invention include polymers obtained by the polycondensation of diazodiphenylamine and formaldehyde. A specific example is a polymer having the following structure:

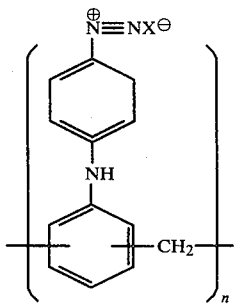

n ≧ 1

The diazonium salts also include ortho- or paraquinonediazides. Specific examples are as follows:

Naphthalene-1,2-diazooxide-4-sulfonic acid;

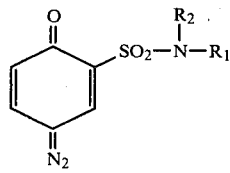

wherein $R_1$ is a hydrogen atom, an alkyl group (e.g., methyl, ethyl, propyl, isopropyl, etc.) or an aralkyl group (e.g., benzyl, phenethyl, etc.); and $R_2$ is an aryl group (e.g., phenyl, tolyl, ethylphenyl, naphthyl, etc.);

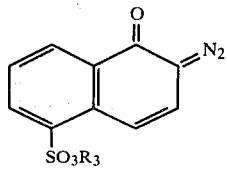

wherein $R_3$ is alkoxy (e.g., methoxy, ethoxy, propoxy, etc.), aryloxy (e.g., phenoxy, tolyloxy, etc.), alkylamino (e.g., methylamino, ethylamino, dimethylamino, diethylamino, etc.), aralkylamino (e.g., benzylamino, dibenzylamino, etc.) or carboxyalkoxyalkyl (e.g., carboxymethoxymethyl, etc.);

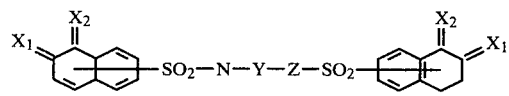

wherein $X_1$ and $X_2$ are $N_2$ or O; Y is arylene (e.g., phenylene, naphthylene, etc.) or alkylene (e.g., methylene, ethylene, trimethylene, tetramethylene, etc.); Z is O or —NR₄, R₄ is hydrogen, alkyl (e.g., methyl, ethyl, propyl, isopropyl, etc.) or aryl (e.g., phenyl, tolyl, ethylphenyl, naphthyl, etc.).

Especially useful diazonium salts for use in the process of this invention are those which have relatively high solubilities in organic solvents, and can be used in a relatively high concentration relative to the binder in forming an organic solvent solution of a photosensitive image-forming composition together with the binder, as will be described hereinbelow.

Usually, two means are available to achieve such conditions. A first means is to render the diazonium cation of the formula $ArN_2^\oplus$ in the general formula $ArN_2^\oplus \cdot X^\ominus$ oleophilic or less hydrophilic by, for example, introducing an alkoxy group into an aromatic ring. A second means is to render the anionic portion $X^\ominus$ oleophilic or less hydrophilic, and for this purpose, tetraphenyl borate, tetrafluoroborate, hexafluorophosphate, hexafluoroarsenate, p-toluenesulfonic acid and hexafluoroantimonate are used instead of metal halides which are usually employed. These compounds form double salts together with the diazonium cations to increase their solubility in organic solvents.

As a result of rendering diazonium salts oleophilic, even when a polymer soluble in an organic solvent is used as a binder, the ratio of the diazonium salt to the binder can be increased to, for example, 1:5 or to 1:1, and a high concentration of the photosensitive material can be obtained. Thus, the ease of image formation is markedly enhanced.

Aromatic azide compounds which can be used in this invention are those of the general formula $N_3$—$R_5$—CH=CH-$R_6$ in which $R_5$ represents a phenylene group, and $R_6$ represents an acyl group (e.g., acetyl, benzoyl) or an azidearyl group. These compounds are known to those skilled in the art from, for example, Kosar, *Light-Sensitive Systems*, John Wiley & Sons, Inc., New York, N.Y. (1965), pp. 330–336.

Also useful are azide compounds belonging to another group described at pages 93 to 97 of Takahiro Tsunoda, *Photo-Sensitive Resins*, Revised Edition, Publishing Department of the Society of Printing (1975), W. S. De Forest, *Photoresist: Materials and Processes*, pp. 19–62 (1975), McGraw-Hill Book Co., New York. Specifically, they include 2,6-dichloro-4-nitroazidobenzene, azidodiphenylamine, 3,3'-dimethoxy-4,4'-diazidodiphenyl, 4'-methoxy-4-azidodiphenylamine, 4,4'-diazidodiphenylamine, 4,4'-diazidodiphenylmethane, 4'-nitrophenylazobenzene-4-azide, 1-azidopyrene, 3,3'-dimethyl-4,4'-diazidodiphenyl, 4,4'-diazidophenylazonaphthalene, p-phenylene bisazide, p-azidobenzophenone, 4,4'-diazidobenzophenone, 4,4'-diazidochalcone, 2,6-di-(4'-azidobenzal)cyclohexane and 2,6-di-(4'-azidobenzal)-4-methylcyclohexanone.

The binder used in the photosensitive composition layer in this invention may be any which does not produce adhesiveness at ordinary temperatures but when heated, becomes softened. Various film-forming compounds are available, but polymers having good film-formability are especially useful. As will be illustrated below, one characteristic of the method of this invention is that a very broad range of polymeric compounds can be used. However, it is necessary to select a binder best suited for the particular purpose the photosensitive image-forming material is used; using as a guide a set of factors including the compatibility of the binder with the diazonium or aromatic azide compound used as a photosensitive compound, the stability of the photosensitive layer, the adhesion of the photosensitive layer to the support and other characteristics of the photosensitive material.

Examples of suitable polymeric binders used in the invention include thermoplastic linear polymers such as polyvinyl butyral, polyvinyl formal, polystyrene, poly(methyl methacrylate), polyvinyl acetate, polyesters, polyamines, polyurethane and polyamides; binary copolymers such as a vinylidene/acrylonitrile copolymer, a styrene/acrylonitrile copolymer, a vinyl methyl ether/maleic anhydride copolymer, a vinyl acetate/maleic anhydride copolymer, a vinyl chloride/vinyl acetate copolymer or a vinyl chloride/styrene copolymer, and ternary or quaternary copolymers containing other third and fourth comonomers. Partially cross-linked water-soluble polymers such as gelatin, polyvinyl alcohol or polyvinyl pyrrolidone, and compounds which are not thermoplastic themselves, such as epoxy resins, can be used if they are improved by mixing with thermoplastic binders or other additives to substantially impart heat-softenability to the photosensitive composition layer.

Polyethylene glycol, rosin, and waxes which have poor film-formability can be used as binders, but they should be used preferably with other polymeric binders to increase the heat-softenability to the photosensitive composition layer. These polymeric substances can be coated on a support as dispersed in an aqueous or organic solvent as a latex.

Examples of thermoplastic polymers which are particularly suitable for the binder used in the photosensitive composition of this invention include vinylidene chloride, a vinylidene chloride/acrylonitrile copolymer, polyvinyl butyral and the like. When the adhesive force of the binder to the peeling development carrier sheet at the peeling development treatment temperature employed is too weak, a good result could be obtained by further providing on the photosensitive composition layer a material which is thermoplastic at a relatively low temperature and exhibits tackiness or stackness, e.g., polyvinyl butyral.

Furthermore, polyvinyl alcohol which is a hydrophilic binder can be advantageously used when the photosensitive substance used is hydrophilic. In such a case, a hydrophobic polymer can be used for coating in a latex form.

Plasticizers which are liquid or viscous at room temperature can be added in amounts do not impair the shape of the photosensitive composition layer.

The peel development effect in accordance with this invention can also be enhanced by adding organic or inorganic fine powders such as colloidal silica, starch, carbon black, glass powders and metal powders.

According to the purpose of use of the relief images obtained after peeling development, the photosensitive composition layer may also contain pigments or dyes, fine metal powders, and magnetic materials or fluorescent substances in the form of molecularly dispersed state or as crystals or fine powders.

The thickness of the photosensitive composition layer is generally from 0.5 $\mu$m to 500 $\mu$m, preferably from 1 $\mu$m to 100 $\mu$m.

The support used to support the photosensitive composition in the process of this invention may be any flat materials, for example, metals such as aluminum, steel, zinc, iron, stainless steel, and brass and hard non-flexible materials such as glass, ceramics, wood or plastics, and flexible materials such as paper, plastic films, fibrous materials, and vacuum-deposited films. The surfaces of these supports may be further processed by coating, vacuum deposition, lamination, polishing, roughening, electrode reaction, discharging, heating, and other known means.

The support may be transparent, non-transparent or colored with dyes or pigments depending on whether the resulting photosensitive material is used as a transparent visible image, a reflective image, a printing plate-making material, etc.

There is no particular restriction on the thickness or configuration of the support. In the case of a film or sheet, its thickness generally ranges from about 10 $\mu$m to several cm. Those having thicknesses outside this range can also be used if they permit coating and bonding, and peeling at the time of heating.

The adhesive composition used on the carrier sheet used in this invention can be a composition which contains a polymeric material and a tackifier as essential ingredients. The polymeric material includes a synthetic rubber, a cellulosic polymeric material or a vinyl-type polymer. Examples of the rubber are natural rubber, butadiene-styrene rubber, isobutylene-isoprene rubber, polychloroprene, polybutylene, polybutadiene, polyisoprene, butadiene-acrylonitrile rubber, chlorinated rubbers, and silicone rubbers. Examples of the cellulosic polymer are ethyl cellulose, butyl cellulose, benzyl cellulose, nitrocellulose, cellulose diacetate, cellulose, propionate, cellulose acetate propionate, and cellulose acetate butyrate. Examples of the vinyl-type polymer include polyvinyl chloride, polyacrylic acid, poly(methyl acrylate), poly(ethyl acrylate), poly(butyl acrylate), polymethacrylate acid, poly(methyl methacrylate), polyvinyl ether, polyvinyl acetal, and copolymers of these.

Specific examples of the tackifier include gum rosin, wood rosin, hydrogenated rosin, methyl abietate, hydrogenated methyl abietate, diethylene glycol abietate, diethylene glycol 2-hydroabietate, a monoethylene glycol ester of rosin, a pentaerythritol ester of rosin, a glycerin ester of rosin, a methanol ester or rosin, hydrogenation products of these rosin esters, coumarone-indene resin, alkyd resins, terpene resins (e.g., poly(1,8-menthadiene)), xylene resins, epoxy resins, terpene-phenol resins, polybutene, polypentene, dammer, copal, animal oils and fats, vegetable oils and fats, and mineral oils.

When the rubber polymer or vinyl-type polymer is used, a plasticizer must be jointly incorporated in the adhesive composition. Examples of the plasticizer are dimethyl phthalate, diethyl phthalate, dibutyl phthalate, dioctyl phthalate, dicyclohexyl phthalate, dimethyl glycol phthalate, butyl phthallyl butyl glycolate, triethylene glycol, chlorinated diphenyl, diisobutyl adipate, and dimethyl sebacate.

If required, the adhesive composition may further contain antioxidants, coloring agents and inorganic or organic fillers. Generally, the adhesive composition is dissolved in a solvent typified by an aromatic hydrocarbon such as benzene, toluene, ethylbenzene or xylene, an aliphatic hydrocarbon such as pentane, cyclohexane, octane or methylcyclohexane, an ether such as methyl ether, ethyl ether or tetrahydrofuran, or a halogenated hydrocarbon such as chloroform, carbon tetrachloride, dichloromethane, dichloroethane or chlorobenzene. The solution is coated on a carrier sheet and dried in a known manner. The thickness of the adhesive composition layer after removal of the solvent is generally from 0.5 $\mu$m to 50 $\mu$m, preferably from 1 $\mu$m to 20 $\mu$m.

Examples of carrier sheet which can be most easily used are commercially available pressure-sensitive adhesive tapes or sheets, paper tapes or sheets, cloth tapes, polyester tapes or sheets, and polyvinyl chloride tapes or sheets.

As is clear from the foregoing description, for image formation by peeling, the materials and constructions of the support, photosensitive layer, and peel developing sheet, and the combination of these are very important. The developing conditions cannot be simply defined, however, they can be determined easily by the artisan without undue experimentation. Generally, however, the temperature at which a sheet having an adhesive composition layer is laminated is from ordinary temperature to 150° C., preferably from ordinary temperature to 100° C.

The peel developing sheet and the photosensitive image-forming material which have thus been heat-laminated are separated from each other by a peeling operation. The temperature at the time of peeling is also very important.

Generally, if the peeling temperature is higher than the softening temperature of the phososensitive composition layer, cohesive destruction of the photosensitive composition layer occurs whereby a part of the area of the photosensitive layer which is to be separated by peeling development adheres to the supporting carrier, and a part of the area which is to remain adheres to the peel developing sheet. Thus, the resulting relief image tends to be incomplete. When the peeling temperature is higher than the softening temperature of the adhesive surface of the peel developing sheet having an adhesive layer, the adhesive layer breaks or undergoes cohesive destruction. Hence, good quality relief images cannot be obtained.

Of course, the adhesion strength between the photosensitive composition layer and the support carrier affects the formation of relief images by peeling.

The peeling temperature which is optimal for the process of this invention also varies widely according to the combination of the supporting carrier, the photosensitive composition layer and the adhesive layer of the peel developing sheet. Generally, the peeling temperature is from room temperature to 100° C., preferably from room temperature to 60° C.

Figure 2:
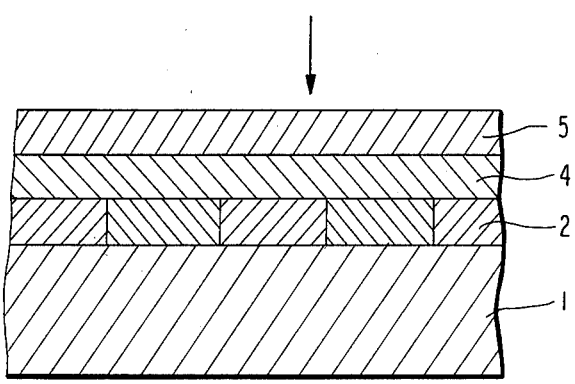
FIG. 2 illustrates the exposed image-forming material in intimate contact with the peeling development carrier sheet.
Figure 3:
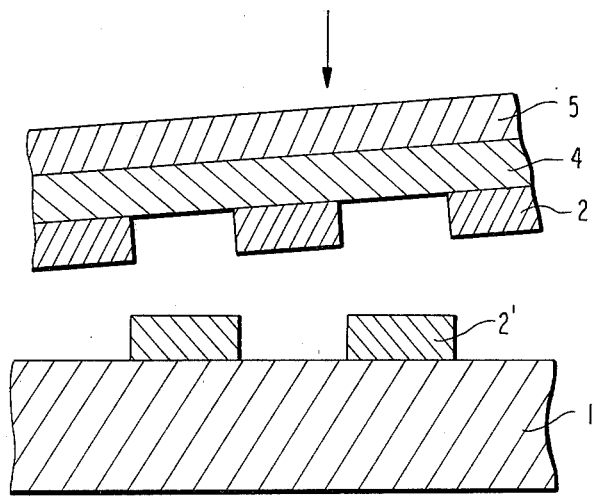
FIG. 3 shows separation of the peeling development carrier sheet from the image-forming material.

Embodiments of the construction of the photosensitive image-forming material used in the invention and the process for image formation in accordance with this invention are described by reference to the accompanying drawings in which FIGS. 1 to 3 illustrate one embodiment of the image-forming process in accordance with this invention.

FIG. 1 illustrates exposure of the photosensitive image-forming material in accordance with this invention through a transparency. The photosensitive image-forming material comprising a support 1 and a photosensitive layer 2 is imagewise exposed through an original image transparency 3.

FIG. 2 illustrates the exposed image-forming material in intimate contact with the peeling development carrier sheet 5 having an adhesive layer 4.

FIG. 3 shows separation of the peeling development carrier sheet from the image-forming material. The exposed area 2' of the photosensitive layer is transferred and adhered to the peeling development carrier sheet, and the unexposed area 2 remains on the support, respectively forming a relief image.

The following Examples illustrate the present invention more specifically. It should be understood, however, that these Examples do not in any way limit the scope of the invention.

EXAMPLE 1

2 g of a 4-morpholinobenzenediazonium/boron tetrafluoride double salt and 2 g of a vinylidene chloride/acrylonitrile copolymer (Saran F-220, a product of Asahi Dow Co., Ltd.) were dissolved in 20 ml of N,N-dimethylformamide to form a photosensitive solution. The photosensitive solution was coated on a grained and anodized aluminum substrate having a thickness of 0.24 $\mu$m using a whirler to form a photosensitive image-forming material. The dry thickness of the photosensitive layer was about 4 $\mu$m. The material was exposed for 20 seconds to light from a 2 kw superhigh mercury lamp (Jet Light, a product of Orc Manufacturing Co., Ltd.) disposed at a distance of 50 cm through a photographic positive transparency contacted intimately with the material. After exposure, an adhesive tape of polyethylene terephthalate having thereon a layer of an adhesive composition (the tape being 31B, a product of Nitto Denko Co., Ltd.) was press-bonded closely to the photosensitive composition layer using rollers, and then at room temperature, the two elements were separated from each other. A positive relief image of good quality was formed on the aluminum plate, and the corresponding negative relief image was formed on the peeled adhesive sheet.

EXAMPLE 2

The procedure of Example 1 was repeated except that 2 g of an m-cresol-type novolak resin (PR 50904, a product of Arakawa Rinsan Co., Ltd.) was used as a binder instead of the Saran used in Example 1. A positive image of good quality was formed on the aluminum substrate.

EXAMPLE 3

The procedure of Example 1 was repeated except that 2 g of the condensation product of 4-N-phenylaminobenzenediazonium and formaldehyde (the degree of polymerization 2 to 8) was used instead of the diazonium compound used in Example 1. A positive image of good quality was formed on the aluminum substrate, and a corresponding negative image was formed on the adhesive tape.

EXAMPLE 4

The procedure of Example 1 was repeated except that 1 g of 4-N,N-dimethylaminobenzenediazonium/tetraphenylboron double salt was used instead of the diazonium compound used in Example 1. A positive image of good quality was formed on the aluminum substrate.

EXAMPLE 5

The procedure of Example 1 was repeated except that 1 g of 2,6-di(4'-azidobenzal)-4-methylcyclohexane was used instead of the diazonium compound used in Example 1. A positive image of good quality was formed on the aluminum substrate.

EXAMPLE 6

The procedure of Example 1 was repeated except that 0.5 g of 1-diazo-2,5-dimethoxy-1-p-tolylmercaptobenzene phosphorus hexafluoride double salt was used instead of the diazonium compound used in Example 1. A positive image of good quality was obtained on the aluminum substrate.

EXAMPLE 7

The procedure of Example 1 was repeated except that 2 g of 2-diazo-1-naphthol-5-sulfonic acid ethyl ether was used instead of the diazonium compound used in Example 1. A positive image of good quality was obtained on the aluminum substrate.

EXAMPLE 8

The procedure of Example 1 was repeated except a substrate composed of polyethylene terephthalate having aluminum vacuum-deposited thereon in a thickness of about 1,000 Å was used instead of the support used in Example 1. A positive relief image of good quality was obtained on the aluminum layer.

EXAMPLE 9

The procedure of Example 1 was repeated except that a support composed of a polyethylene terephthalate film and a subbing layer of gelatin was used instead of the aluminum plate used in Example 1. A positive relief image of good quality was obtained on the support.

EXAMPLE 10

The procedure of Example 1 was repeated except that a support composed of an aluminum substrate and a 1μ thick layer of polyvinyl alcohol formed on it was used instead of the aluminum substrate used in Example 1. A positive relief image of good quality was obtained on the support.

EXAMPLE 11

2 g of a 4-morpholino-2,5-dibutoxybenzene diazonium/boron tetrafluoride double salt and 2 g of polyvinyl butyral were dissolved in 40 ml of ethyl alcohol to form a photosensitive solution. The solution was coated on an aluminum substrate which had been grained, anodized and treated with sodium silicate to obtain a photosensitive image-forming material. The image-forming material was imagewise exposed as in Example 1, and then brought into intimate contact under heat with an adhesive film (31E, a product of Nitto Denko, Co., Ltd.) comprising a polyethylene terephthalate film and an adhesive composition layer formed thereon by means of a heat laminator (Fuji Laminater D-13, a product of Fuji Photo Film Co., Ltd.) in which the roller temperature was maintained at 80° C. The two elements were then peeled from each other. A positive relief image of good quality was obtained on the aluminum substrate.

While the invention has been described in detail and with reference to specific embodiments thereof, it will be apparent to one skilled in the art that various changes and modifications can be made therein without departing from the spirit and scope thereof.

What is claimed is:

1. A process for forming an image, which comprises imagewise exposing a photosensitive image-forming material consisting of a non-transparent support or support colored with dyes or pigments, said support having formed thereon a layer of a photosensitive composition, said photosensitive composition layer being in intimate contact with an original image transparency during said imagewise exposing and said composition containing a diazonium compound or an aromatic azide compound and a binder which imparts heat-softenability to the photosensitive composition layer wherein said layer is a solid layer not tacky at temperature ranges between about 5° C. to 40° C. and then adhering the photosensitive composition layer closely to a development carrier sheet having thereon a layer of adhesive composition comprising a polymeric material and a tackifier; and peeling said image-forming material and said carrier sheet from each other at a temperature which is lower than the softening temperature of the photosensitive composition layer and lower than the softening temperature of the layer of adhesive on said carrier sheet to imagewise separate said photosensitive composition layer and to transfer and adhere the entire exposed area of the photosensitive layer to the carrier sheet and thereby form a relief image on the carrier sheet, and the non-transferred unexposed area of the photosensitive composition remains on the support also forming a relief image simultaneously with the relief image on the carrier sheet.

2. A process for forming an image, which comprises imagewise exposing a photosensitive image-forming material composed of a non-transparent support or support colored with dyes or pigments, said support having formed thereon as the uppermost layer a layer of a photosensitive composition, said photosensitive composition layer being in intimate contact with an original image transparency during said imagewise exposing and said composition containing a diazonium compound or an aromatic azide compound and a binder which imparts heat-softenability to the photosensitive composition layer wherein said layer is a solid layer not tacky at temperature ranges between about 5° C. to 40° C. and then adhering the photosensitive composition layer closely to a development carrier sheet having thereon a layer of an adhesive composition comprising a polymeric material and a tackifier and peeling said image-forming material and said carrier sheet from each other at a temperature which is lower than the softening temperature of the photosensitive composition layer and lower than the softening temperature of the layer of adhesive on said carrier sheet to imagewise separate said photosensitive composition layer and to transfer and adhere the entire exposed area of the photosensitive layer to the carrier sheet and thereby form a relief image on the carrier sheet, and the non-transferred unexposed area of the photosensitive composition remains on the support also forming a relief image simultaneously with the relief image on the carrier sheet.

3. The process of claim 1 or claim 2 wherein said photosensitive composition layer is adhered to said development carrier sheet at a temperature from ordinary temperature up to 150° C.

4. The process of claim 1 or claim 2, wherein said photosensitive image-forming material is exposed prior to application of said carrier sheet with the photosensitive composition layer of said image-forming material being in intimate contact with the original image transparency.

5. The process of claim 1 or claim 2, wherein said diazonium compound is rendered less hydrophilic.

6. The process of claim 1 or claim 2, wherein said diazonium compound is represented by the formula $$ArN=N^+X^-$$

wherein Ar represents an aromatic ring substituted at the 4-position with an alkylamino group, a phenylamino group, an N-heterocyclic group, or a mercapto group and X is an anion.

7. The process of claim 1 or claim 2, wherein said azide compound is represented by the formula $$N_3-R_5-CH=CH-R_6$$

wherein $R_5$ is phenylene and $R_6$ is an acyl group or an azide aryl group.

8. The process of claim 1 or claim 2, wherein said adhesive composition contains a rubber, a cellulosic polymeric material or a vinyl polymer.

9. The process of claim 1 or claim 2, wherein said peeling development is carried out at room temperature to 100° C.

10. The process of claim 1 or claim 2, wherein said layer of said photosensitive composition is from 0.5 μm to 500 μm thick.

11. The process the claim 1 or claim 2, wherein said peeling temperature is from room temperature to about 60° C.

12. The process of claim 1 or claim 2, wherein said diazonium compound is selected from the group consisting of 4-morpholino-benzene diazonium/boron tetrafluoride double salt, the condensation product of 4-N-phenylamino-benzenediazonium and formaldehyde, 4-N,N-dimethylaminobenzenediazonium/tetraphenylboron double salt, 2,6-di(4'-azidobenzal)-4-methylcyclohexane, 1-diazo-2,5-di-methoxy-1-p-tolylmercaptobenzene phosphorous hexafluoride double salt, 2-diazo-1-naphthol-5-sulfonic acid ethyl ether, and 4-morpholino-2,5-dibutoxybenzene diazonium/boron tetrafluoride double salt; and wherein said binder is selected from the group consisting of vinylidene chloride/acrylonitrile copolymer, m-cresol-type novolak resin, and polyvinyl butyral; and wherein said support is selected from the group consisting of grained and anodized aluminum, polyethylene terephthalate having aluminum vacuum-deposited thereon in a thickness of about 1,000 Å, polyethylene terephthalate having a subbing layer of gelatin, aluminum having a 1μ thick layer of polyvinyl alcohol, aluminum which has been grained, anodized and treated with sodium silicate.

13. The process of claim 1 or claim 2, wherein said diazonium compound has an oleophilic moiety.

14. The process of claim 13, wherein said oleophilic moiety is alkoxy substituted on an aromatic ring of said diazonium compound.

15. The process of claim 13, wherein said oleophilic moiety is an anion of said diazonium compound selected from the group consisting of tetraphenylborate, tetrafluoroborate, hexafluorophosphate, hexafluoroarsenate, p-toluenesulfonic acid and hexafluoroantimonate.

* * * * *